United States Patent [19]

Ueda et al.

[11] Patent Number: 4,847,661
[45] Date of Patent: Jul. 11, 1989

[54] IMAGE RECORDING APPARATUS USING MICROCAPSULE CARRYING SHEET AND SEPARATE DEVELOPER SHEET

[75] Inventors: Masashi Ueda; Shunichi Higashiyama, both of Nagoya, Japan

[73] Assignee: Brother Kogyo Kabushiki Kaisha, Aichi, Japan

[21] Appl. No.: 165,971

[22] Filed: Mar. 9, 1988

[30] Foreign Application Priority Data

Mar. 20, 1987 [JP] Japan .................................. 62-66291

[51] Int. Cl.⁴ ........................ G03B 27/32; G03B 27/52
[52] U.S. Cl. ........................................ 355/27; 430/138
[58] Field of Search ................... 355/27, 77; 430/138, 430/211, 235, 962; 354/302–304, 319

[56] References Cited

U.S. PATENT DOCUMENTS

| | | | |
|---|---|---|---|
| 4,624,560 | 11/1986 | Beery ..................................... | 355/27 |
| 4,648,699 | 3/1987 | Holycross et al. ................ | 355/27 X |
| 4,714,943 | 12/1987 | Sakakibara et al. ................... | 355/27 |
| 4,727,392 | 2/1988 | Stone et al. ....................... | 355/27 X |
| 4,740,809 | 4/1988 | Yamamoto et al. .................. | 355/27 |
| 4,742,374 | 5/1988 | Yamamoto et al. .................. | 355/27 |
| 4,768,050 | 8/1988 | Beery ................................ | 355/27 X |
| 4,782,364 | 11/1988 | Takagi .............................. | 355/27 X |
| 4,785,332 | 11/1988 | Nagumo et al. ..................... | 355/27 |

Primary Examiner—Richard A. Wintercorn
Attorney, Agent, or Firm—Oliff & Berridge

[57] ABSTRACT

An image recording apparatus using a microcapsule carrying member and a developer member. The microcapsule carrying member includes a substrate and a plurality of microcapsules on the substrate, and each of the microcapsules includes a chromogenic material and a photo-curable material. The developer member includes a developer layer formed on a substrate. A pressure unit is provided for rupturing the microcapsules and reacting the developer material with the non-cured chromogenic material even upon light exposure. A calendering unit is provided at a position downstream of the pressure unit for calendering an imaging surface of the developer member.

7 Claims, 2 Drawing Sheets

IMAGE RECORDING APPARATUS USING MICROCAPSULE CARRYING SHEET AND SEPARATE DEVELOPER SHEET

CROSS-REFERENCE TO RELATED APPLICATION

This patent application is related to U.S. patent application Ser. No. 112,217 filed on Oct. 26, 1987.

BACKGROUND OF THE INVENTION

The present invention relates to an image recording apparatus using a microcapsule carrying sheet and a separate developer sheet.

In a photocopying technique of this kind, the microcapsule carrying sheet includes a substrate and microcapsules coated thereon. Each of the microcapsules contains a chromogenic material (dye precursor or color former) and a phtosensitive material (photo-curable resin). On the other hand, the developer sheet includes a substate and developer material coated thereon. Upon light exposure, curing of the photosensitive material in the microcapsules occurs in light-exposed areas of the microcapsule layer. When the microcapsule layer and the developer material layer are in pressure contact with each other, the microcapsules at unexposed parts in remaining parts of the microcapsule layer are ruptured. As a result, the dye precursor flowed from the ruptured capsules is reacted with the developer material for forming an image on the developer sheet in conformance with an original image.

One conventional image recording apparatus is shown in FIG. 1. According to the apparatus, a weblike microcapsule carrying sheet 6 extends between a sheet cassette roll 5 and a take-up roller 7. A light source 1 is disposed above a trichromatic resolution filter 2, and a light transmittive member 3 on which a picture image is provided is disposed below the filter 2. A condensing lens 4 is disposed below the light transmittive member 3, and the microcapsule carryng sheet 6 brigding between the sheet cassette roll 5 and the take-up roller 7 confronts the condensing lens 4. A developer sheet cassette 8 in which developer sheets 9 are stacked is disposed above the capsule carrying web 6. A feed roller 10 is provided to successively feed the developer sheet over the weblike sheet 6. A pressure unit P such as a pair of pressure rollers 11 is provided at a position downstream of the confluent position of the sheet 6 and the sheet 9. Further, an image fixing unit H such as a pair of heat rollers 12 is disposed downstream of the pressure rollers 11.

Light emitted from the light source 1 passes through the trichromatic resolution filter 2, the light transmittive member 3 and the condensing lens 4, so that a microcapsule layer of the capsule carrying sheet 6 is irradiated. As a result, a latent image is formed on the capsule carrying sheet 6 in conformance with the picture image on the transmittive member 3. This latent image is formed upon photo-curing of the photo-curable resin in the microcapsules as shown by reference numeral 6a in FIG. 2(b) because of the light exposure. Upon completion of the light exposure, the sheet 6 is transferred in a direction A by the rotation of the take-up roller 7. During this sheet transfer, the feed roller 10 is operated to discharge the developer sheet 9 stacked on the sheet cassette 8, so that the developer material layer of the developer sheet 9 is overlapped with the microcapsule layer of the sheet 6 at the confluent position, and these sheets 6 and 9 pass through the pair of pressure rollers 11. As a result, remaining microcapsules whose photocurable resins are maintained in their liquid state because of non light exposure are ruptured, and the dye precursor of the remaining microcapsules is reacted with the developer material of the developer sheet 9 for providing color image on the developer sheet 9 in conformance with the original image. The pair of heat rollers 12 is disposed allowing the developer sheet 9 to pass therethrough in order to perform image fixing. As a result, coloring quality is improved to enhance gloss level.

With this arrangement, during pressure contact between the microcapsule carrying sheet 6 and the developer sheet 9 at the pressure rollers 11, minute recesses 9a may be formed on the surface of the developer sheet 9 as shown in FIG. 2(b) at positions corresponding to the photo-cured portions 6a of the capsule carrying sheet 6 due to their rigidity. Therefore, glossy image may not be finally obtainable on the developer sheet 9 due to the surface irregularities, even if the sheet 9 passes through the heat rollers 11.

SUMMARY OF THE INVENTION

It is therefore an object of the present invention to overcome the above-described drawbacks and to provide an improved image recording apparatus.

Another object of this invention is to provide a device capable of removing surface irregularities on the developer sheet which surface irregularities have been inevitably formed when the developer sheet and the microcapsule carrying sheet pass through the pressure unit under pressure.

Briefly, and in accordance with the present invention, these objects are attained by providing a calendering unit a downstream side of the pressure unit. That is, the image recording apparatus of this invention includes a light exposure unit for exposing light onto a microcapsule carrying member in accordance with an original imaging information, and, a pressure unit for providing pressure contact between the microcapsule carrying member and a developer member. The microcapsule carrying member carries a plurality of microcapsules each confining therein a chromogenic material and photo-sensitive material which is cured upon light exposure, and the developer member includes a developer material which reacts with the chromogenic material. The pressure unit ruptures the microcapsules for providing reaction between the developer material and the chromogenic material flowed from non-cured microcapsules. A calendering unit is further disposed at a downstream side of the pressure unit for calendering the developer member, so that surface unevenness on the developer member, which unevenness is formed at the pressure unit, is cleared by the calendering unit.

BRIEF DESCRIPTION OF THE INVENTION

In the accompanying drawings.

DETAILED DESCRIPTION OF THE PREFERRED EMBODIMENTS

Figure 1:
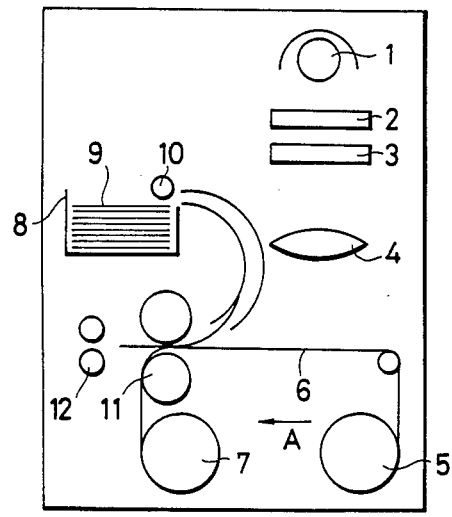
FIG. 1 is a schematic elevational view showing a conventional image recording apparatus.
Figure 2A:
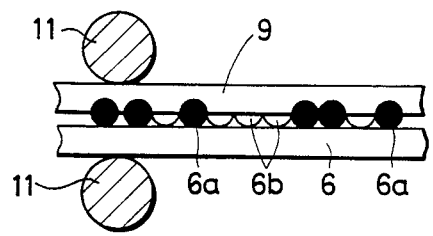
FIG. 2(a) is a cross-sectional view showing a microcapsule carrying sheet and a developer sheet confronting therewith at pressure rollers in the conventional apparatus.
Figure 2B:
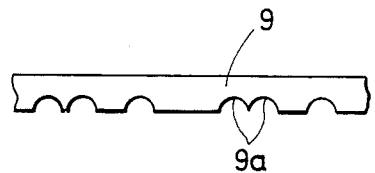
FIG. 2(b) is a cross-sectional view showing the developer sheet after image formation in the conventional apparatus.

A first embodiment according to this invention will be described with reference to FIG. 3, wherein like parts and components are designated by the same reference numerals as those shown in FIG. 1.

In this embodiment, provided are a light source 1, a trichromatic resolution filter 2, a light transmittive member 3, a condensing lens 4, a sheet cassette roll 5, a microcapsule carrying sheet 6, a take-up roller 7, a developer sheet cassette 8, developer sheets 9, a feed roller 10, pressure unit P (a pair of pressure rollers 11), and an image fixing unit H (a pair of heat rollers 12). These components are all identical with those of the conventional apparatus shown in FIG. 1, and therefore, details thereof are omitted for simplicity.

In the first embodiment of this invention, there is further provided a calendering unit C such as a pair of calender rollers 13 disposed at a downstream side of the heat rollers 12.

As described above, when the microcapsule carrying sheet 6 and the developer sheet 9 pass through the pressure rollers 11, the photo-cured and solidified capsules formed by light irradiatio may degrade the surface of the developer sheet 9. However, in this embodiment, since the developer sheet 9 further passes through the calender rollers 13, surface unevenness of the developer sheet 9 can be eliminated. Therefore, resultant developer sheet 9 can provide a glossy surface, and the picture image having high quality is obtainable on the surface of the developer sheet 9.

Figure 4:
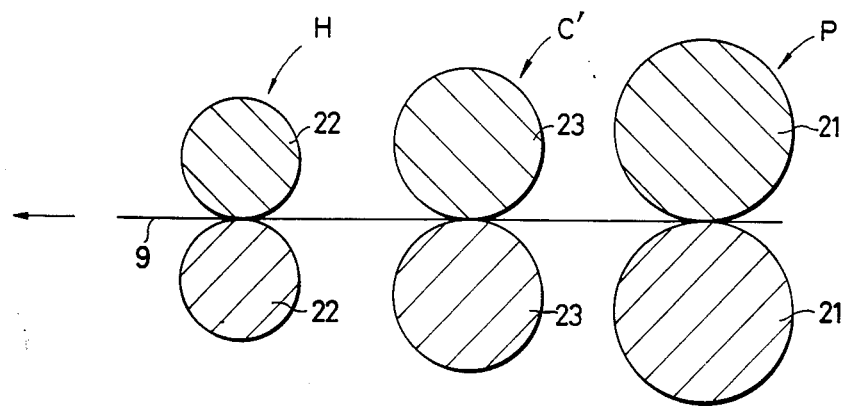
FIG. 4 is an enlarged cross-sectional view showing an essential portion according to a second embodiment of this invention; and, FIG. 5 is a cross-sectional view showing an essential portion according to a third embodiment of this invention.

In the first embodiment, the developer sheet 9 passes through, the pressure rollers 11 at first, then the heat rollers 12, and then the calender rollers 13. However, in a second embodiment of this invention, a calendering unit C' consisting of a pair of calendering rollers 23 are disposed between a pair of pressure rollers 21 and a pair of heat rollers 22, so that the developer sheet 9 passes through, successively, the pressure rollers 21, calendering rollers 23 and the heat rollers 22 as shown in FIG. 4. According to the second embodiment, glossy surface is also obtainable at the picture image surface of the developer sheet 9.

Figure 5:
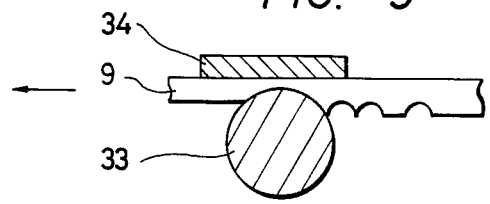

Further, instead of the employment of two rollers as the calendering unit, according to a third embodiment of this invention, the unit C'' can be provided by a single roller 33 and a single plate 34 as shown in FIG. 5. The single roller 33 is adapted to contact the irregular surface of the developer sheet 9. The developer sheet 9 passes between the roller 33 and the plate 34. It goes without saying that this calendering unit in the third embodiment can be positioned at a downstream side of the heat rollers 12, or be positioned between the pressure rollers 11 and the heat rollers 12.

A substrate of the developer sheet 9 is not limited to paper, but various types of substrates are available.

Figure 3:
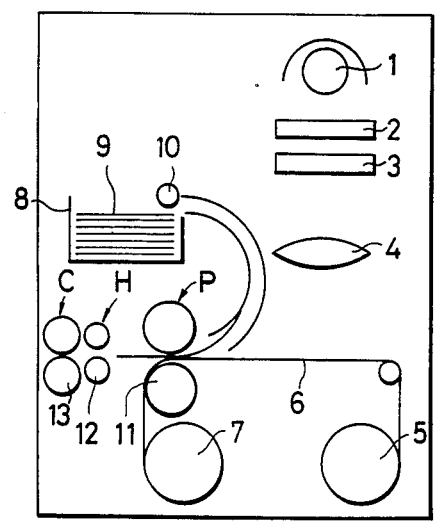
FIG. 3 is a schematic elevational view showing an image recording apparatus according to a first embodiment of the present invention.

Further, the present invention provided with the calendering unit C, C' or C'' is applicable to various types of image recording apparatus other than those shown in FIGS. 1 and 3.

In view of the foregoing, according to the present invention, the resultant developer sheet can provide a glossy surface at the image fixing surface, and therefore, an excellent picture image is obtainable.

While the invention has beed described in detail with reference to specific embodiments thereof, it will be apparent for those skilled in the art that various changes and modifications can be made therein without departing from the spirit and scope of the invention.

What is claimed is:

1. In an image recording apparatus including a light exposure unit for exposing light onto a microcapsule carrying member in accordance with an original imaging information, and, a pressure unit for providing pressure contact between said microcapsule carrying member and a developer member, said microcapsule carrying member carrying a plurality of microcapsules each confining therein a chromogenic material and photosensitive material which is curable upon light exposure, and said developer member including a developer material which reacts with said chromogenic material, said pressure unit rupturing said microcapsules for providing reaction between said developer material and said chromogenic material in non-cured microcapsules to provide a picture image on said developer member, the improvement comprising: a calendering unit disposed at a downstream side of said pressure unit for calendaring said developer member.

2. The improvement of claim 1, further comprising an image fixing unit disposed at a downstream side of said presure unit, said calendering unit being disposed at a downstream side of said image fixing unit.

3. The improvement of claim 1, further comprising an image fixing unit disposed at a downstream side of said pressure unit, said calendering unit being disposed between said pressure unit and said image fixing unit.

4. The improvement of claim 2, wherein said calendaring unit comprises a pair of calendaring rollers for interposing said developer member therebetween.

5. The improvement of claim 3, wherein said calendaring unit comprises a pair of calendaring rollers for interposing said developer member therebetween.

6. The improvement of claim 2, wherein said calendering unit comprises a single roller and a plate member for interposing said developer member therebetween, said single roller being in contact with an imaging surface of said developer member.

7. The improvement of claim 3, wherein said calendering unit comprises a single roller and a plate member for interposing said developer member therebetween, said single roller being in contact with an imaging surface of said developer member.

* * * * *